United States Patent
Wu et al.

(10) Patent No.: US 12,334,287 B2
(45) Date of Patent: Jun. 17, 2025

(54) VACUUM DEGREE DETECTION DEVICE, MONITORING SYSTEM, AND VACUUM ARC EXTINGUISHING CHAMBER THEREOF

(71) Applicant: XI'AN JIAOTONG UNIVERSITY, Shaanxi (CN)

(72) Inventors: Yi Wu, Shaanxi (CN); Hailong He, Shaanxi (CN); Chunping Niu, Shaanxi (CN); Mingzhe Rong, Shaanxi (CN); Hongrui Ren, Shaanxi (CN); Xiaolong Chen, Shaanxi (CN)

(73) Assignee: XI'AN JIAOTONG UNIVERSITY, Xi'an (CN)

( * ) Notice: Subject to any disclaimer, the term of this patent is extended or adjusted under 35 U.S.C. 154(b) by 220 days.

(21) Appl. No.: 18/200,381

(22) Filed: May 22, 2023

(65) Prior Publication Data

US 2023/0377819 A1    Nov. 23, 2023

(30) Foreign Application Priority Data

May 23, 2022  (CN) .......................... 202210566163.0
May 23, 2022  (CN) .......................... 202210567533.2

(51) Int. Cl.
| | | |
|---|---|---|
| *H01H 33/668* | (2006.01) | |
| *G01L 21/12* | (2006.01) | |
| *H01H 33/662* | (2006.01) | |
| *H10N 10/13* | (2023.01) | |
| *H10N 19/00* | (2023.01) | |

(52) U.S. Cl.
CPC .......... *H01H 33/668* (2013.01); *G01L 21/12* (2013.01); *H01H 33/66207* (2013.01); *H10N 10/13* (2023.02); *H10N 19/00* (2023.02); *H01H 2033/66223* (2013.01)

(58) Field of Classification Search
CPC .......... H01H 33/668; H01H 33/66207; H01H 2033/66223; H01H 11/0062; G01L 21/12; H10N 10/13; H10N 19/00
USPC .................................................. 218/122, 121
See application file for complete search history.

(56) References Cited

U.S. PATENT DOCUMENTS 4,163,130 A * 7/1979 Kubota ................ H01H 33/668
                                                          313/577
4,672,323 A * 6/1987 Kuhl .................... H01H 33/668
                                                          324/463

(Continued)

*Primary Examiner* — William A Bolton

(57) ABSTRACT

The present disclosure discloses a vacuum degree detection device, a monitoring system and a vacuum arc-extinguishing chamber thereof, wherein, in the vacuum degree detection device, a ceramic insulating housing is sealingly fixed to an end face cover plate of the vacuum arc-extinguishing chamber, the ceramic insulating housing is a circular ring-shaped structure coaxial with a conductive rod on the end face cover plate, a sealing area formed by the end face cover plate and the ceramic insulating housing is provided with a through hole communicating with the vacuum arc-extinguishing chamber; a thermoelectric vacuum sensor is disposed inside the ceramic insulating housing to detect the vacuum degree of the vacuum arc-extinguishing chamber, a cold end is fixed to the end face cover plate, an electrode is supported on the cold end, a thermoelectric arm is supported on the electrode, a hot end is laminated to the thermoelectric arm.

20 Claims, 8 Drawing Sheets

(56) References Cited

U.S. PATENT DOCUMENTS

| | | | | |
|---|---|---|---|---|
| 5,286,933 A | * | 2/1994 | Pham | H01H 33/668 |
| | | | | 324/424 |
| 6,153,846 A | * | 11/2000 | Morita | H01H 33/668 |
| | | | | 218/124 |
| 7,225,676 B2 | * | 6/2007 | Randazzo | H01H 33/668 |
| | | | | 218/123 |
| 9,870,885 B2 | * | 1/2018 | Kovacich | G01N 27/021 |

* cited by examiner

VACUUM DEGREE DETECTION DEVICE, MONITORING SYSTEM, AND VACUUM ARC EXTINGUISHING CHAMBER THEREOF

CROSS-REFERENCE TO RELATED APPLICATIONS

This application claims priorities from the Chinese patent applications 2022105675332 and 2022105661630 filed May 23, 2022, the content of which are incorporated herein in the entirety by reference.

TECHNICAL FIELD

The present disclosure belongs to the technical field of on-line detection of vacuum degree, and particularly to a vacuum degree detection device of a vacuum arc-extinguishing chamber, a monitoring system and a vacuum arc-extinguishing chamber thereof, and also relates to a more versatile vacuum degree detection device, which is based on a temperature difference power generation device.

BACKGROUND

Vacuum technology, as a practical basic technology, has been widely used because it provides a thin gas atmosphere and clean environmental conditions, which is beneficial to degassing, drying, evaporation, arc extinguishing and so on. Accurately measuring the vacuum degree of a gas is important for scientific research and industrial production. In the field of aerospace, vacuum measurement is needed in the environment detection and simulation test of satellites, launch vehicles and manned spaceships, space material effect evaluation and dangerous gas leakage monitoring. In the electronics industry including each process and test process of electronic device manufacturing, accurate vacuum measurements is needed for material purification, film preparation, ion etching and machining, sealing and performance testing. During the manufacture and use of electrical equipment, the measurement of the vacuum degree is also related to the quality of the product and its life of application. In addition, there are very wide applications in nuclear material purification, nuclear power plant safety monitoring, high energy accelerators, aviation engine testing and manufacturing processes.

Currently, the main vacuum measurement modes include a capacitance thin film gauge, a thermal conduction vacuum gauge, an ionization vacuum gauge, and the like. The capacitance thin film gauge, which measures in the range of 1E5 to 1E-2 Pa, has the advantage of accurate measurement, and has the disadvantage that the material properties and structural dimensions of the film directly affect the capacitance change of film caused by surface pressure, and then affect the range and accuracy of vacuum measurement. The important representatives of the thermal conduction vacuum gauge are thermocouple gauges and Pirani gauges (resistance gauges). The measurement range is 1E5 to 1E-2, the thermal conduction vacuum gauge has the advantages of easy manufacture and low price, and has the disadvantage that the measurement result is related to the gas type, easy to be polluted and greatly affected by the environment. The ionization vacuum gauge can be divided into cold cathode ionization and hot cathode ionization, and the measurement range is 1E-1 to 1E-5. The hot cathode ionization gauge has the advantage of accurate and stable measurement, but its disadvantage is that when the (absolute) pressure is higher than 1E-1 Pa, it is easy to oxidize the filament. The cold cathode ionization gauge has the advantage that the filament is not easy to oxidize, but its disadvantages are measurement discontinuity, discharge delay effect at low pressure and instability.

In addition, in the field of electric power equipment, the vacuum interrupter is continuously developed toward miniaturization and high voltage degree, and a high vacuum environment in the arc extinguishing chamber of the vacuum interrupter is a prerequisite for ensuring excellent performance of the vacuum interrupter. Therefore, the real-time monitoring of the vacuum degree in the vacuum arc-extinguishing chamber during the operation of the vacuum interrupter has become an important research content in the field of vacuum interrupters.

For the manufacture of the vacuum arc-extinguishing chamber, the one-time exhausting and sealing process is adopted, that is, the vacuum arc-extinguishing chamber is brazed into several parts, and then the processes of exhausting, baking, brazing and sealing are completed in the vacuum furnace. The baking temperature of the vacuum arc-extinguishing chamber can be as high as 800-900° C. during the process. With the conventional vacuum degree detection method, the detection device is difficult to withstand high temperatures and cannot be implanted in the arc-extinguishing chamber when it leaves the factory. In a high temperature environment, the lifetime of the detection device is also difficult to guarantee. For the off-line detection device, detection of the vacuum degree is required after the arc-extinguishing chamber is taken out of operation, real-time monitoring cannot be achieved for problems such as slow air leakage.

The above information disclosed in the Background section is only for enhancement of understanding of the background of the disclosure and therefore may contain information that does not constitute the prior art that is well known to those of ordinary skill in the art.

SUMMARY

In view of the problems existing in the prior art, in the field of electric power, the present disclosure provides a vacuum degree detection device of a vacuumarc-extinguishing chamber, a monitoring system and a vacuum arc-extinguishing chamber thereof, wherein the measurement of the vacuum degree of the vacuumarc-extinguishing chamber is achieved by using a thermoelectric vacuum sensor, and each part of the thermoelectric vacuum sensor uses a high temperature resistant material. The present disclosure solves the cases where the conventional detection device is not resistant to high temperature, the detection accuracy is reduced at high temperature, and can realize implantation when the arc-extinguishing chamber leaves the factory. The body of the vacuum degree detection device of the vacuum arc-extinguishing chamber adopts a circular ring structure, occupies a small space, has a wide application range, and can satisfy the vacuum degree detection requirements of the medium-high-voltage vacuum arc-extinguishing chambers at a voltage degree of 12 kV and above. The vacuum degree detection device has advantages of on-line detection, simple implementation, long life, and high temperature resistance.

To this end, the present disclosure discloses a vacuum degree detection device of a vacuum arc-extinguishing chamber, including:

a ceramic insulating housing sealingly fixed to an end face cover plate of the vacuum arc-extinguishing chamber, the ceramic insulating housing being a circular ring-shaped structure coaxial with a conductive rod on the end face cover plate, a sealing area formed by the end face cover plate and the ceramic insulating housing being provided with a through hole communicating with the vacuum arc-extinguishing chamber;

a thermoelectric vacuum sensor disposed inside the ceramic insulating housing to detect the vacuum degree of the vacuum arc-extinguishing chamber, the thermoelectric vacuum sensor including, a cold end fixed to the end face cover plate through which heat is transferred with the conductive rod to keep the temperature of the cold end of the sensor relatively stable;

an electrode supported on the cold end;

a thermoelectric arm supported on the electrode;

a hot end laminated on the thermoelectric arm;

a thermal resistance block laminated on the hot end; and a heating device laminated on the thermal resistance block The vacuum degree detection device of the vacuum arc-extinguishing chamber, further including, a conductive sheet conductively connected with the thermoelectric vacuum sensor; and a conductive wire penetrating through and soldered on the ceramic insulating housing, the conductive wire being conductively connected with the conductive sheet.

The conductive wire is a cylindrical conductive wire connected with the thermoelectric vacuum sensor and is drawn from the ceramic insulating housing and the end face cover plate through a ceramic insert, and the ceramic insert is welded to the end face cover plate.

In the vacuum degree detection device of the vacuum arc-extinguishing chamber, the thermoelectric vacuum sensor is a circular ring-shaped structure disposed within the ceramic insulating housing and coaxial with the conductive rod on the end face cover plate.

In the vacuum degree detection device of the vacuum arc-extinguishing chamber, the ceramic insulating housing is sealingly fixed to an outer side of the end face cover plate away from the vacuum arc-extinguishing chamber, and the through hole is provided on the end face cover plate.

In the vacuum degree detection device of the vacuum arc-extinguishing chamber, the ceramic insulating housing is sealingly fixed to an inner side of the end face cover plate adjacent to the vacuum arc-extinguishing chamber, and the through hole is provided on the ceramic insulating housing.

In the vacuum degree detection device of the vacuum arc-extinguishing chamber, the end face cover plate is a static cover plate or a moving cover plate of the vacuum arc-extinguishing chamber.

In addition, the present disclosure also discloses a vacuum arc-extinguishing chamber monitoring system, including:

the vacuum degree detection device of the vacuum arc-extinguishing chamber;

a temperature sensor disposed between a thermal resistance block and a heating device to generate temperature data;

a sensor receiving module receiving a detection signal and temperature data of the vacuum degree detection device;

a data processing module connected with the sensor receiving module to generate vacuum degree data based on the detection signal and adjust a heating temperature of the heating device based on the temperature data;

a data storage module connected with the data processing module to receive and store the vacuum degree data; and a data monitoring module connected with the data processing module, the data monitoring module performing an alarm when the vacuum degree data exceeds a predetermined threshold value.

In the vacuum arc-extinguishing chamber monitoring system, the data monitoring module includes a buzzer or an LED light.

In addition, the present disclosure also discloses a vacuum arc-extinguishing chamber including:

a ceramic housing being a hollow cylindrical structure;

a static cover plate sealingly brazed to one end of the ceramic housing;

a static conductive rod penetrating through a central position of the static cover plate;

a moving cover plate sealingly brazed to the other end of the ceramic housing;

a moving conductive rod penetrating through a central position of the moving cover plate;

the vacuum degree detection device of the vacuum arc-extinguishing chamber provided on an upper surface or a lower surface of the moving cover plate or the static cover plate and arranged coaxially with the conductive rod; and a shield disposed inside the ceramic housing.

Compared to the prior art, the present disclosure has the following advantages: the vacuum degree detection device of the vacuum arc-extinguishing chamber of the present disclosure can be installed at the end face cover plate coaxial with the conductive rod, therefore, the occupation space is small, the requirement of miniaturization of the detection device can be satisfied, the application range is wide, and the insulation performance and the working performance of the vacuum arc-extinguishing chamber are not affected, and the vacuum degree detection device can satisfy the vacuum degree detection requirements of the medium-high-voltage vacuum arc-extinguishing chambers at a voltage degree of 12 kV and above. The thermoelectric vacuum sensor can withstand the high temperature when the vacuum arc-extinguishing chamber is manufactured and baked, and the detection device is implanted into the vacuum arc-extinguishing chamber when the vacuum arc-extinguishing chamber leaves the factory, so it does not need to be installed later.

In addition, the present disclosure provides a more general vacuum degree detection device based on a temperature difference power generation device, including:

a vacuum cavity, a cooling portion supported within the vacuum cavity;

a temperature difference power generation device, wherein one end of which is laminated on the cooling portion, the temperature difference power generation device includes a plurality of pairs of thermoelectric arms, the thermal resistance of the temperature difference power generation device is formed by the thermal resistances of the thermoelectric arms and the thermal resistances of air portions filling gaps in parallel, and when a vacuum degree at which the temperature difference power generation device is located is changed, the thermal resistance of the temperature difference power generation device is changed to generate detection data reflecting the vacuum degree;

a thermal resistance block laminated on the other end of the temperature difference power generation device;

a heat source portion laminated on and heating the thermal resistance block; and a pressure cylinder that applies pressure to the heat source portion.

In comparison with other vacuum degree detection devices, the above-described vacuum degree detection device based on the temperature difference power generation device enables continuous measurement of air pressure in the range of 1E5 Pa to 1E-2 Pa, and has a wide measurement range. The vacuum degree detection device is also simple to manufacture, accurate in measurement, and long in work life.

In the vacuum degree detection device based on the temperature difference power generation device, the temperature difference power generation device and the thermal resistance block are arranged in series to form a whole.

In the vacuum degree detection device based on the temperature difference power generation device, the heat source portion is a ceramic heating sheet or a flexible heating sheet.

In the vacuum degree detection device based on the temperature difference power generation device, the material of the thermal resistance block includes nitride, oxide, epoxy resin or glass fiber.

In the vacuum degree detection device based on the temperature difference power generation device, the thermal resistance block is provided with a first measuring point connected with a first temperature detection device, and the bottom of the temperature difference power generation device is provided with a second measuring point connected with a second temperature detection device.

In the vacuum degree detection device based on the temperature difference power generation device, the first temperature detection device includes a thermocouple, a platinum resistor or a thermistor, and/or the second temperature detection device includes a thermocouple, a platinum resistor or a thermistor.

In the vacuum degree detection device based on the temperature difference power generation device, the heat source portion is connected with a DC power source, and the temperature difference power generation device is connected with a data acquisition device.

In the vacuum degree detection device based on the temperature difference power generation device, the heat source portion is attached to the thermal resistance block via a copper sheet, and the temperature difference power generation device is attached to the cooling portion via a copper sheet.

In the vacuum degree detection device based on the temperature difference power generation device, the cooling portion is connected with a constant temperature water bath to form a circulating cooling system.

BRIEF DESCRIPTION OF FIGURES

Various additional advantages and benefits of the present disclosure will become apparent to those of ordinary skill in the art upon reading the following detailed description of the preferred embodiments. The drawings in the specification are only for the purpose of illustrating the preferred embodiments and are not to be construed as limiting the present disclosure. It is obvious that the drawings described below are merely some embodiments of the present disclosure, for those of ordinary skill in the art, other drawings can also be obtained according to these drawings under the premise of paying no creative effort. Also, like reference numerals refer to like parts throughout the drawings.

In the Drawings.

Figure 1:
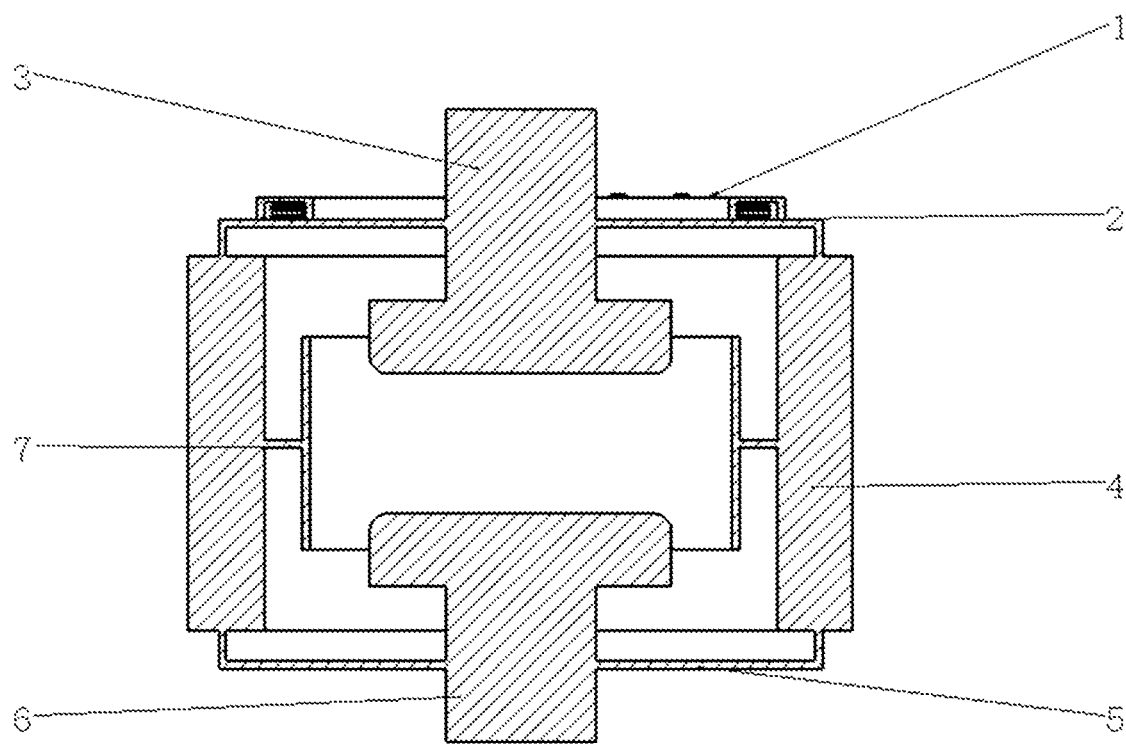
FIG. 1 is a structural schematic diagram of a vacuum arc-extinguishing chamber according to an embodiment of the present disclosure.

The present disclosure is further explained below with reference to the accompanying drawings and embodiments.

DETAILED DESCRIPTION

Specific embodiments of the present disclosure will be described in more detail below with reference to the accompanying drawings. While specific embodiments of the present disclosure are illustrated in the drawings, it should be understood that the present disclosure may be embodied in various forms and should not be limited by the embodiments set forth herein. Rather, these embodiments are provided to enable a more thorough understanding of the disclosure and to fully convey the scope of the disclosure to those skilled in the art.

It should be noted that certain terms are used throughout the specification and claims to refer to certain components. It will be appreciated by those skilled in the art that different terms may be used to refer to the same component. This specification and the claims do not use noun differences as a way of distinguishing components, but use functional differences of components as a distinguishing criterion. As referred to throughout the specification and the claims, "contain" or "include" is an open-ended term and is therefore construed as "containing but not limited to". The following description describes preferred embodiments for carrying out the present disclosure, but the description is for the purpose of general principles of the specification and is not intended to limit the scope of the present disclosure. The scope of the present disclosure is defined by the appended claims.

In order to facilitate understanding of the embodiments of the present disclosure, specific embodiments will now be further explained by way of example with reference to the accompanying drawings, which are not to be construed as limiting the embodiments of the present disclosure.

For better understanding, as shown in FIGS. 1 to 7, the vacuum degree detection device of the vacuum arc-extinguishing chamber includes, a ceramic insulating housing 11 sealingly fixed to an end face cover plate of the vacuum arc-extinguishing chamber, the ceramic insulating housing 11 being a circular ring-shaped structure coaxial with a conductive rod on the end face cover plate, a sealing area formed by the end face cover plate and the ceramic insulating housing 11 being provided with a through hole communicating with the vacuum arc-extinguishing chamber;

a thermoelectric vacuum sensor 13 disposed inside the ceramic insulating housing 11 to detect the vacuum degree of the vacuum arc-extinguishing chamber, the thermoelectric vacuum sensor 13 including, a cold end 131 fixed to the end face cover plate through which heat is transferred with the conductive rod to keep the temperature of the cold end of the sensor relatively stable;

an electrode 132 supported on the cold end 131;

a thermoelectric arm 133 supported on the electrode 132;

a hot end 134 laminated on the thermoelectric arm 133;

a thermal resistance block 135 laminated on the hot end 134; and a heating device 136 laminated on the thermal resistance block 135.

In a preferred embodiment of the vacuum degree detection device of the vacuum arc-extinguishing chamber, the device further including, a conductive sheet conductively connected with the thermoelectric vacuum sensor 13; and a conductive wire 12 penetrating through and soldered on the ceramic insulating housing 11, the conductive wire 12 being conductively connected with the conductive sheet.

In a preferred embodiment of the vacuum degree detection device of the vacuum arc-extinguishing chamber, the conductive wire 12 is a cylindrical conductive wire 12 provided on an upper surface of the ceramic insulating housing.

In a preferred embodiment of the vacuum degree detection device of the vacuum arc-extinguishing chamber, the thermoelectric vacuum sensor 13 is a circular ring-shaped structure disposed within the ceramic insulating housing 11 and coaxial with the conductive rod on the end face cover plate.

In a preferred embodiment of the vacuum degree detection device of the vacuum arc-extinguishing chamber, the ceramic insulating housing 11 is sealingly fixed to an outer side of the end face cover plate away from the vacuum arc-extinguishing chamber, and the through hole is provided on the end face cover plate.

In a preferred embodiment of the vacuum degree detection device of the vacuum arc-extinguishing chamber, the ceramic insulating housing 11 is sealingly fixed to an inner side of the end face cover plate adjacent to the vacuum arc-extinguishing chamber, and the through hole is provided on the ceramic insulating housing 11.

In a preferred embodiment of the vacuum degree detection device of the vacuum arc-extinguishing chamber, the end face cover plate is a static cover plate 2 or a moving cover plate 5 of the vacuum arc-extinguishing chamber.

In one embodiment, since the temperature difference power generation device in the thermoelectric vacuum sensor includes a plurality of pairs of thermoelectric arms, the thermal resistance of the temperature difference power generation device is formed by the thermal resistances of the thermoelectric arms and the thermal resistances of air portions filling gaps in parallel, and when a vacuum degree at which the temperature difference power generation device is located is changed, the thermal resistances of the air portions filling the gaps change, which leads to the thermal resistance change of the temperature difference power generation device. The whole thermal resistance change of the temperature difference power generation device will change the distribution of the thermoelectric vacuum sensor, which will change the temperature of the hot end of the temperature difference power generation device and lead to the output voltage change of the temperature difference power generation device. When the temperature at both ends of the thermoelectric vacuum sensor is constant, the change of vacuum degree is the only factor that causes the change of the overall thermal resistance of the temperature difference power generation device, and thus causes the change of the output voltage of the temperature difference power generation device to generate the detection data reflecting the vacuum degree, thus realizing identification of the vacuum degree. For the thermoelectric vacuum sensor based on this principle, when the thermal resistance block in the thermoelectric vacuum sensor meets the thermal resistance matching principle, that is, the thermal resistance of the thermal resistance block is the same as that of the temperature difference power generation device, and the temperature difference power generation device meets the design principle, that is, the number of pairs of the thermoelectric arms is as much as possible, the output voltage of the temperature difference power generation device is guaranteed to be greater than 500 mV under the temperature difference of 200° C. The duty cycle is as low as possible, not exceeding 10%. The Seebeck coefficient of the thermoelectric material should be as large as possible, which needs to reach 200 µV/K. When the thermal resistance of the thermoelectric arm is as large as possible and the thermal resistance of a single thermoelectric arm is at least 400 K/W, the vacuum degree in the range of 1e5 Pa~1e-2 Pa can be continuously measured, and the vacuum degree in the vacuum arc-extinguishing chamber can be well measured.

In one embodiment, the vacuum degree detection device is installed at the end face cover plate of the vacuum arc-extinguishing chamber, and includes a thermoelectric vacuum sensor 13, a ceramic insulator and a cylindrical conductive wire 12 penetrating through and soldered on the ceramic insulator. The thermoelectric vacuum sensor 13 is formed in a circular shape and mounted on a position coaxially with the conductive rod, and is connected with the conductive wire 12 on the ceramic insulator through a conductive sheet. The ceramic insulator is welded to the end face cover plate of the vacuum arc-extinguishing chamber to seal the vacuum environment.

The thermoelectric vacuum detection device uses the thermoelectric vacuum sensor 13 to detect the vacuum degree of the vacuum arc-extinguishing chamber. The thermoelectric vacuum sensor 13 includes a cold end 131, a hot end 134, an electrode 132, a thermoelectric arm 133, a thermal resistance block 135, a temperature measuring device, and a heating device 136. The components of the thermoelectric vacuum sensor 13 are made of high temperature resistant materials that can withstand the high temperatures during assembly, baking, and brazing during manufacture of the vacuum arc-extinguishing chamber. Due to the temperature resistance characteristic of the thermoelectric vacuum sensor, the thermoelectric vacuum sensor can be integrated with the other components of the vacuum arc-extinguishing chamber and the processes of exhausting, baking, degassing, brazing, and sealing can be performed in a vacuum furnace. The temperature of this process can often reach 900° C., which greatly limits the factory implantation of other vacuum sensors. As a part of the vacuum arc-extinguishing chamber, the thermoelectric vacuum sensor does not need to change the existing process flow of the vacuum arc-extinguishing chamber, and can be implanted in factory, which is convenient for popularizing and using the vacuum detection device of the vacuum arc-extinguishing chamber.

The ceramic insulator of the thermoelectric vacuum detection device is made into a circular ring as an insulating housing of the thermoelectric vacuum detection device. The ceramic insulating housing 11 is welded on the end face cover plate of the vacuum arc-extinguishing chamber, and the thermoelectric vacuum sensor 13 is mounted inside the ceramic insulating housing 11. A small hole is formed at the end face cover plate of the bottom of the ceramic insulating housing 11 and communicates with the vacuum arc-extinguishing chamber, so that on one hand, the vacuum degree in the thermoelectric vacuum sensor 13 and the vacuum degree of the vacuum arc-extinguishing chamber are the same; on the other hand, damage to the original vacuum arc-extinguishing chamber structure is minimized.

The cold end 131 of the thermoelectric vacuum sensor 13 is welded to the end face cover plate of the vacuum arc-extinguishing chamber, the end face cover plate of the vacuum arc-extinguishing chamber is mostly metal and has good thermal conductivity. The cold end of the thermoelectric vacuum sensor is welded at the end face cover plate to directly dissipate heat from the cold end 131 through the end face cover plate or a heat dissipating device may be added to the end face cover plate to dissipate heat from the cold end 131 to keep the temperature of the cold end relatively stable.

A vacuum degree detection signal of the thermoelectric vacuum detection device can be drawn through the conductive wire 12 on the ceramic insulator or the detection signal can be sent to an external monitoring system through a built-in wireless transmission device.

The thermoelectric vacuum degree detection device can be powered by a battery, mains supply, and an electromagnetic induction energy taking mode.

As a second implementation mode, the structure of the vacuum detection device may also be such that the vacuum detection device is mounted on the inner side of the end face cover plate of the vacuum arc-extinguishing chamber, i.e. located in the vacuum arc-extinguishing chamber. The cold end 131 of the thermoelectric vacuum sensor 13 is abutted to the end face cover plate of the vacuum arc-extinguishing chamber, and heat is dissipated from the cold end 131 by directly dissipating heat from the end face cover plate or by adding the heat dissipating device to the end face cover plate to maintain the temperature of the cold end relatively stable. The end face cover plate is provided with a notch for leading out the conductive wire 12, and the notch is sealed with the ceramic insulator. The conductive wire 12 penetrates through and is soldered on the ceramic insulator, and insulation of the conductive wire 12 and the end face cover plate is achieved.

A vacuum arc-extinguishing chamber monitoring system includes, the vacuum degree detection device 1 of the vacuum arc-extinguishing chamber;

a temperature sensor disposed between the thermal resistance block 135 and a heating device 136 to generate temperature data;

a sensor receiving module receiving a detection signal and temperature data of the vacuum degree detecting device;

a data processing module connected with the sensor receiving module to generate vacuum degree data based on the detection signal and adjust a heating temperature of the heating device 136 based on the temperature data;

a data storage module connected with the data processing module to receive and store the vacuum degree data; and a data monitoring module connected with the data processing module, the data monitoring module performing an alarm when the vacuum degree data exceeds a predetermined threshold value.

In one embodiment, the monitoring system includes a sensor receiving module, a data processing module, a data storage module, and a data monitoring module. The sensor receiving module receives the detection signal transmitted from the vacuum degree detection device, and sends the detection signal to the data processing module, and the data processing module processes and analyzes the received detection signal to obtain a corresponding vacuum degree. The data processing module transmits the vacuum degree data to the data storage module and the data monitoring module, and the data monitoring module controls displaying of the vacuum degree and alarms the drop of the vacuum degree. The data storage module is configured to save historical data. The data processing module also processes the temperature signal from the temperature measuring device and controls the heating device 136 to heat the hot end 134 of the thermoelectric vacuum sensor.

Figure 2:
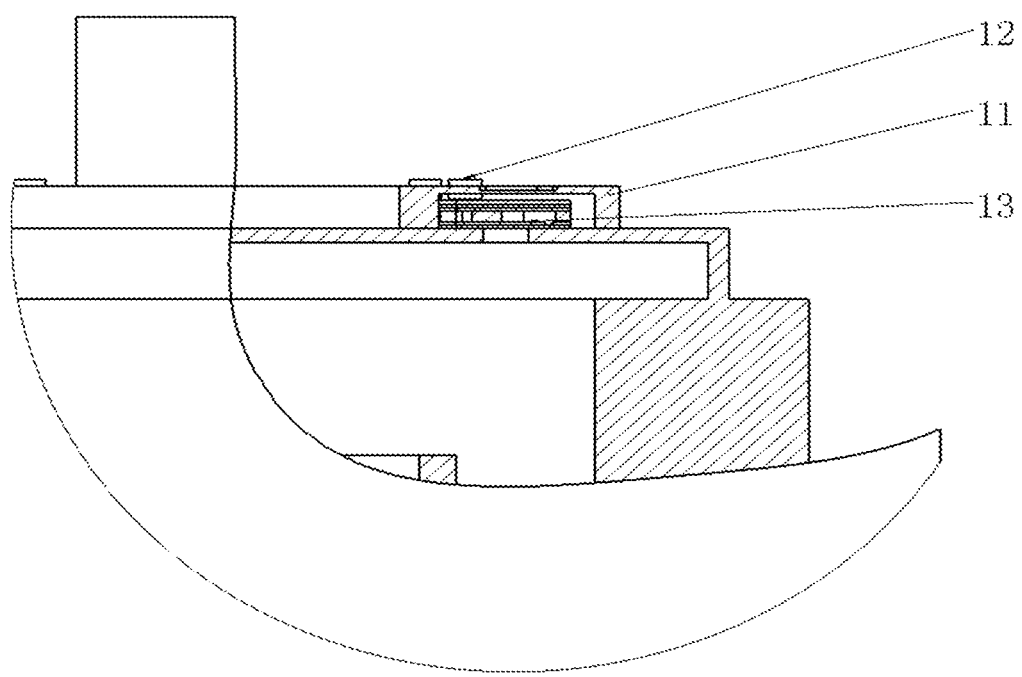
FIG. 2 is a partially enlarged schematic diagram of a vacuum degree detection device of the vacuum arc-extinguishing chamber according to an embodiment of the present disclosure.
Figure 3:
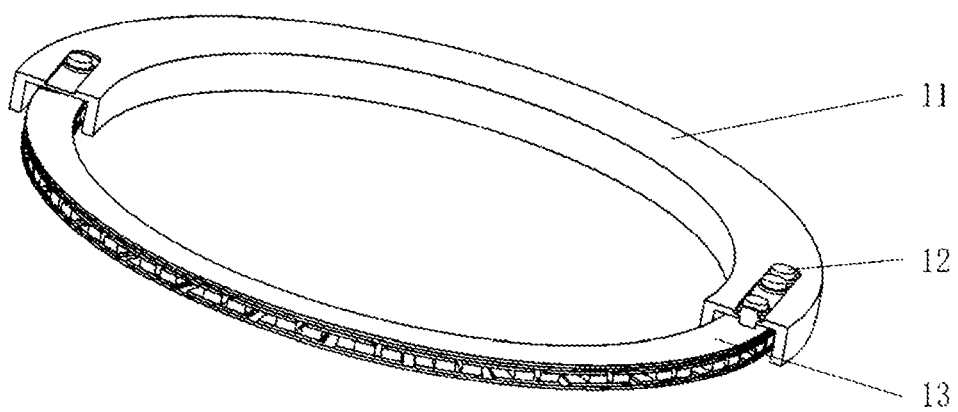
FIG. 3 is a structural schematic diagram of the vacuum degree detection device of the vacuum arc-extinguishing chamber according to an embodiment of the present disclosure.
Figure 4:
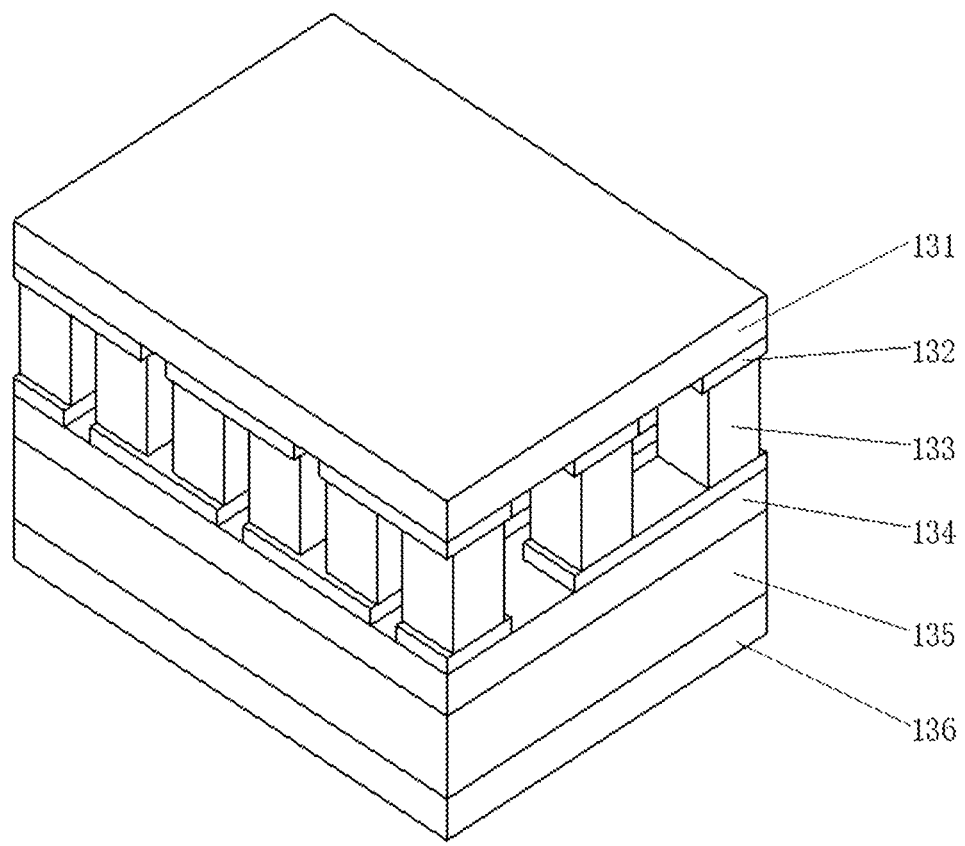
FIG. 4 is a structural schematic diagram of a thermoelectric vacuum sensor of the vacuum degree detection device of the vacuum arc-extinguishing chamber according to an embodiment of the present disclosure.

Referring to FIGS. 2-3, the ceramic insulating housing 11 is brazed on the end face cover plate 2 of the vacuum arc-extinguishing chamber, and the end face cover plate in the ceramic insulating housing is provided with a small hole to communicate with the vacuum arc-extinguishing chamber so that the vacuum degree in the ceramic insulating housing conforms to the vacuum degree in the vacuum arc-extinguishing chamber. Inside the ceramic insulating housing, there is a circular ring-shaped thermoelectric vacuum sensor. The ceramic insulating housing has the conductive wire soldered through the insulating housing, and the detection signal, temperature data, etc. can be transmitted to the external monitoring system via the conductive wire. FIG. 4 is a structural schematic diagram of the thermoelectric vacuum sensor including a cold end 131, an electrode 132, thermoelectric arms 133, a hot end 134, a thermal resistance block 135, and a heating device 136, which is similarly formed as a circular ring mounted inside the ceramic insulating housing 11 according to the illustrated structure. The temperature measuring device may use a thermometric probe or be installed between the thermal resistance block and the heating device for measuring the heating temperature. The cold end of the thermoelectric vacuum sensor is welded to the static end cover plate 2 of the vacuum arc-extinguishing chamber, and heat dissipation is performed on the cold end through the end face cover plate. The thermoelectric vacuum sensor transmits signals and provides energy through the conductive wire on the ceramic insulating housing. Each part of the thermoelectric vacuum sensor is made of a high temperature resistant material that can withstand the high temperatures during assembly, baking and brazing during the manufacture of the vacuum arc-extinguishing chamber and factory implantation is realized.

Figure 5:
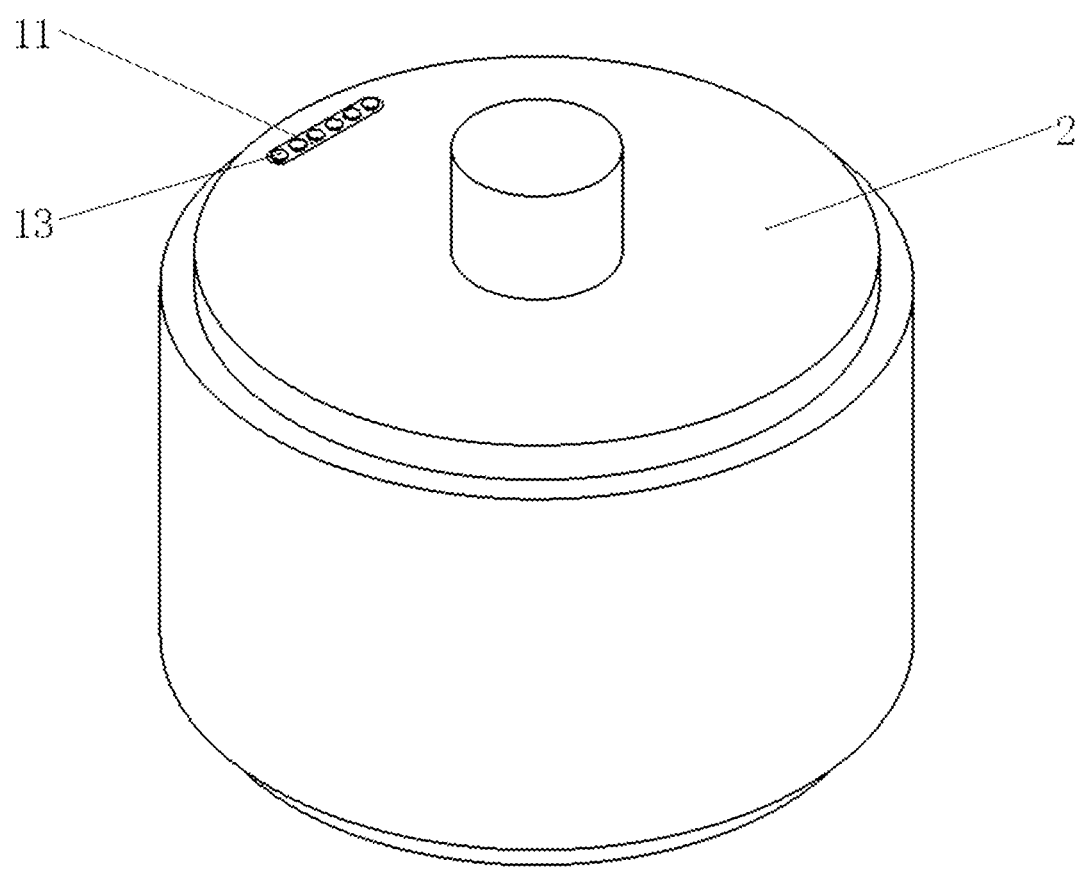
FIG. 5 is a structural schematic diagram of the vacuum arc-extinguishing chamber according to an embodiment of the present disclosure.
Figure 6:
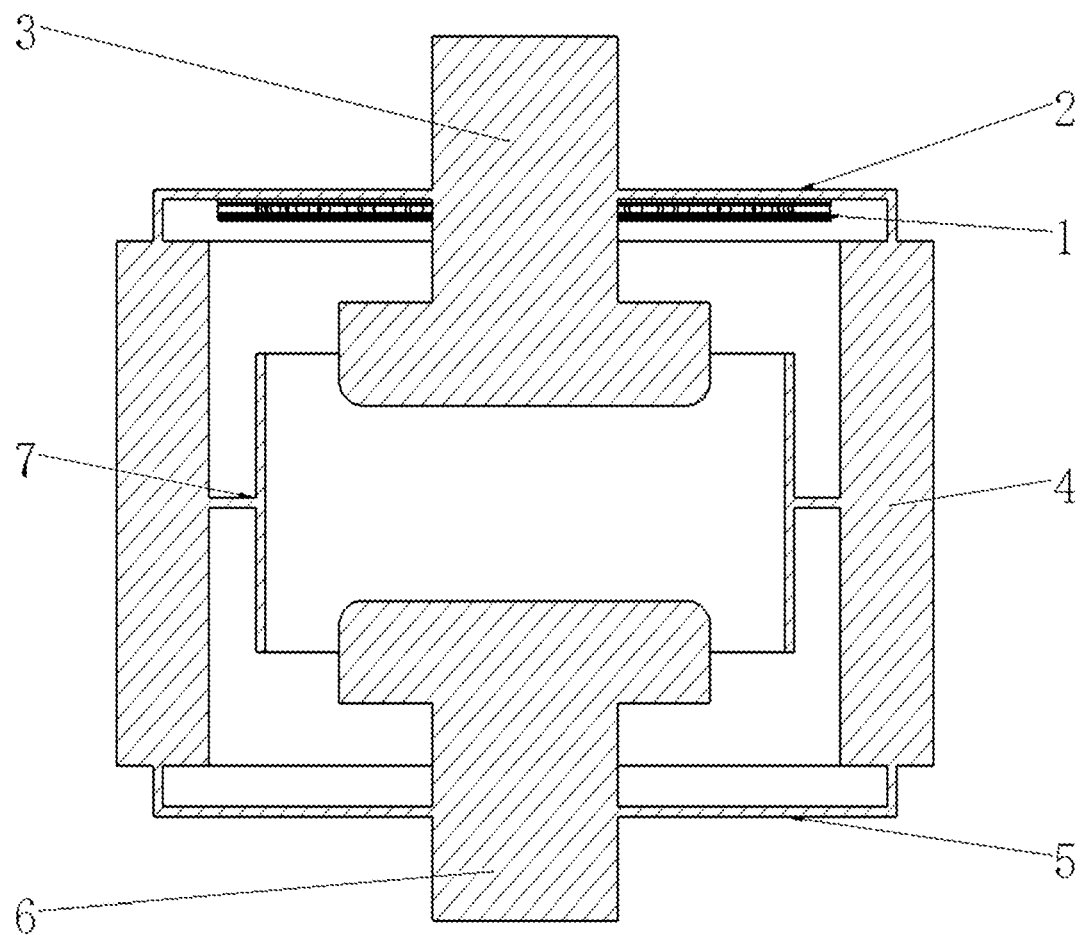
FIG. 6 is an installation schematic diagram of the vacuum degree detection device of the vacuum arc-extinguishing chamber according to an embodiment of the present disclosure.
Figure 7:
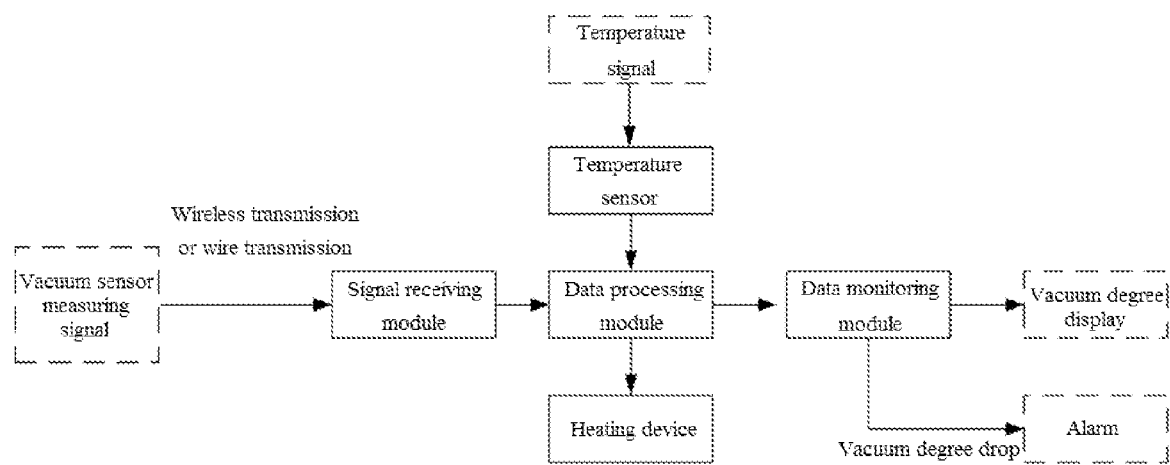
FIG. 7 is a structural schematic diagram of a vacuum degree monitoring system according to an embodiment of the present disclosure.

Referring to FIGS. 5 to 6, the structure of the vacuum detection device may also be such that the thermoelectric vacuum sensor 13 is formed as a circular ring mounted on the inner side of the static cover plate 2 or the moving cover plate 5 of the vacuum arc-extinguishing chamber, i.e. located in the vacuum arc-extinguishing chamber. A ceramic insert 11 is used at the end face cover plate to seal the vacuum arc-extinguishing chamber. The ceramic insert is uniformly perforated with circular holes for leading the conductive wire 12, the conductive wire passes through the circular holes and is pin-sealed with sealing ceramic. The thermoelectric vacuum sensor is mounted directly within the arc extinguishing chamber and can be sealed without the use of the ceramic insulating housing. The cold end of the thermoelectric vacuum sensor of the vacuum detection device is abutted against the end face cover plate of the vacuum arc-extinguishing chamber to dissipate heat from the cold end. The detection signal can be led out by the electrode on the ceramic insert or transmitted to the external monitoring system by wireless transmission.

In one embodiment of the vacuum arc-extinguishing chamber monitoring system, the data monitoring module includes a buzzer or an LED light.

A vacuum arc-extinguishing chamber includes,
a ceramic housing 4 being a hollow cylindrical structure;
a static cover plate 2 sealingly brazed to one end of the ceramic housing 4;
a static conductive rod 3 penetrating through a central position of the static cover plate 2;
a moving cover plate 5 sealingly brazed to the other end of the ceramic housing 4;
a moving conductive rod 6 penetrating through a central position of the moving cover plate 5;
a vacuum degree detection device of the vacuum arc-extinguishing chamber, provided on an upper surface or a lower surface of the moving cover plate or the static cover plate and arranged coaxially with the conductive rod; and
a shield 7 disposed inside the ceramic housing 4.

In one embodiment, as shown in FIG. 1, the vacuum arc-extinguishing chamber includes a vacuum detection device 1, a static cover plate 2, a static conductive rod 3, a ceramic housing 4, a moving cover plate 5, a moving conductive rod 6, and a shield 7. The static cover plate 2 and the moving cover plate 5 are brazed on the ceramic housing 4. The vacuum detection device 1 is mounted on either the static end cover plate 2 or the moving cover plate 5.

The thermoelectric vacuum sensor of the present disclosure is in communication with the vacuum arc-extinguishing chamber such that the measured vacuum degree is a reflection of the vacuum degree within the arc-extinguishing chamber. Vacuum detection signals can be sent to the external monitoring system by the conductive wire on the ceramic insulator or by wireless transmission. The external monitoring system can get the vacuum degree in the arc-extinguishing chamber by analyzing and processing the signals, and realize the real-time monitoring of the vacuum degree in the vacuum arc-extinguishing chamber. The packaging process of the vacuum arc-extinguishing chamber needs to complete exhausting, baking and device sealing in a vacuum furnace at 800-900° C. The disclosure adopts the thermoelectric vacuum sensor with high temperature resistance for detecting the vacuum degree, which can realize the implantation when the arc-extinguishing chamber leaves the factory, and the thermoelectric vacuum sensor can be used in the field of online monitoring of the vacuum degree in the vacuum arc-extinguishing chamber.

Figure 8:
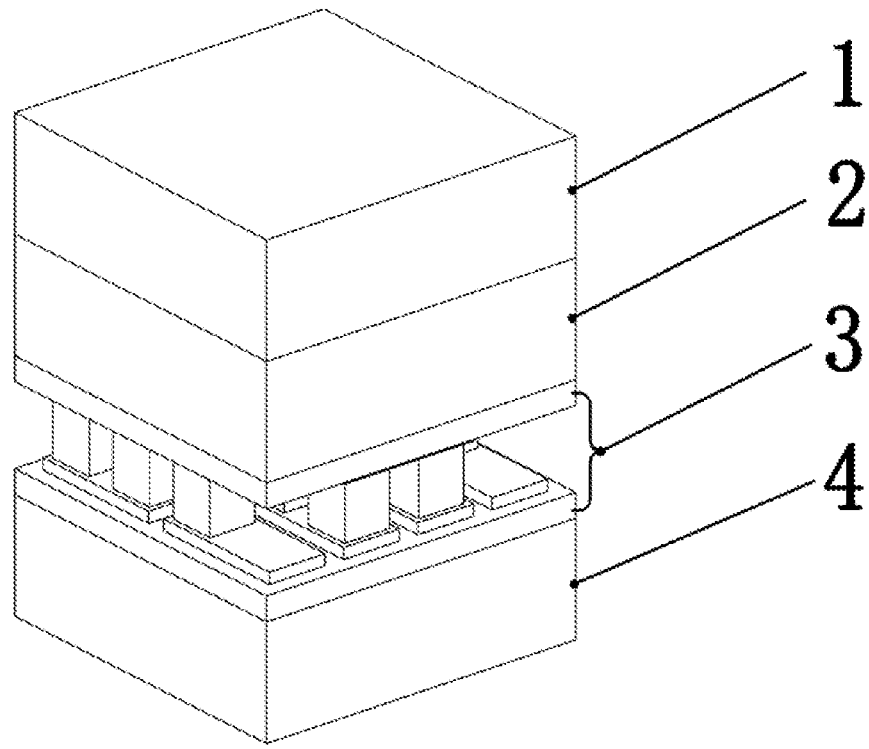
FIG. 8 is a structural schematic diagram of the vacuum degree detection device based on a temperature difference power generation device according to an embodiment of the present disclosure.
Figure 9:
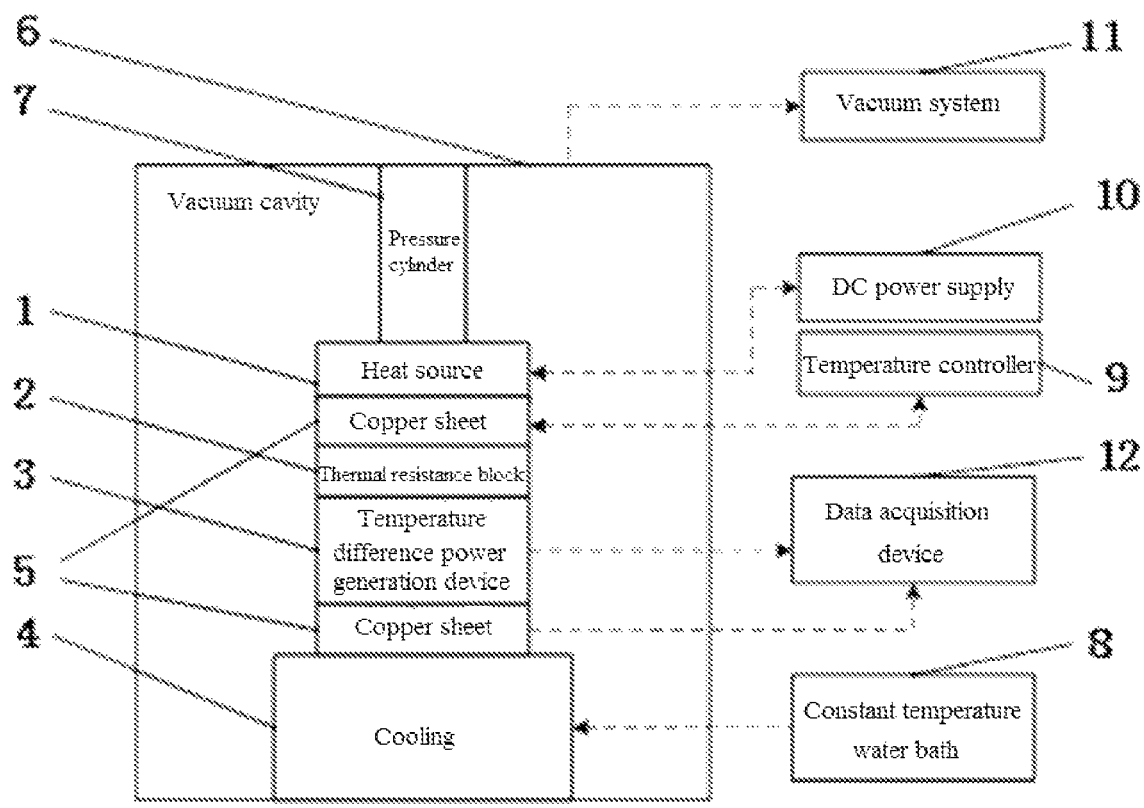
FIG. 9 is a structural schematic diagram of the vacuum degree detection device based on the temperature difference power generation device according to an embodiment of the present disclosure.
Figure 10:
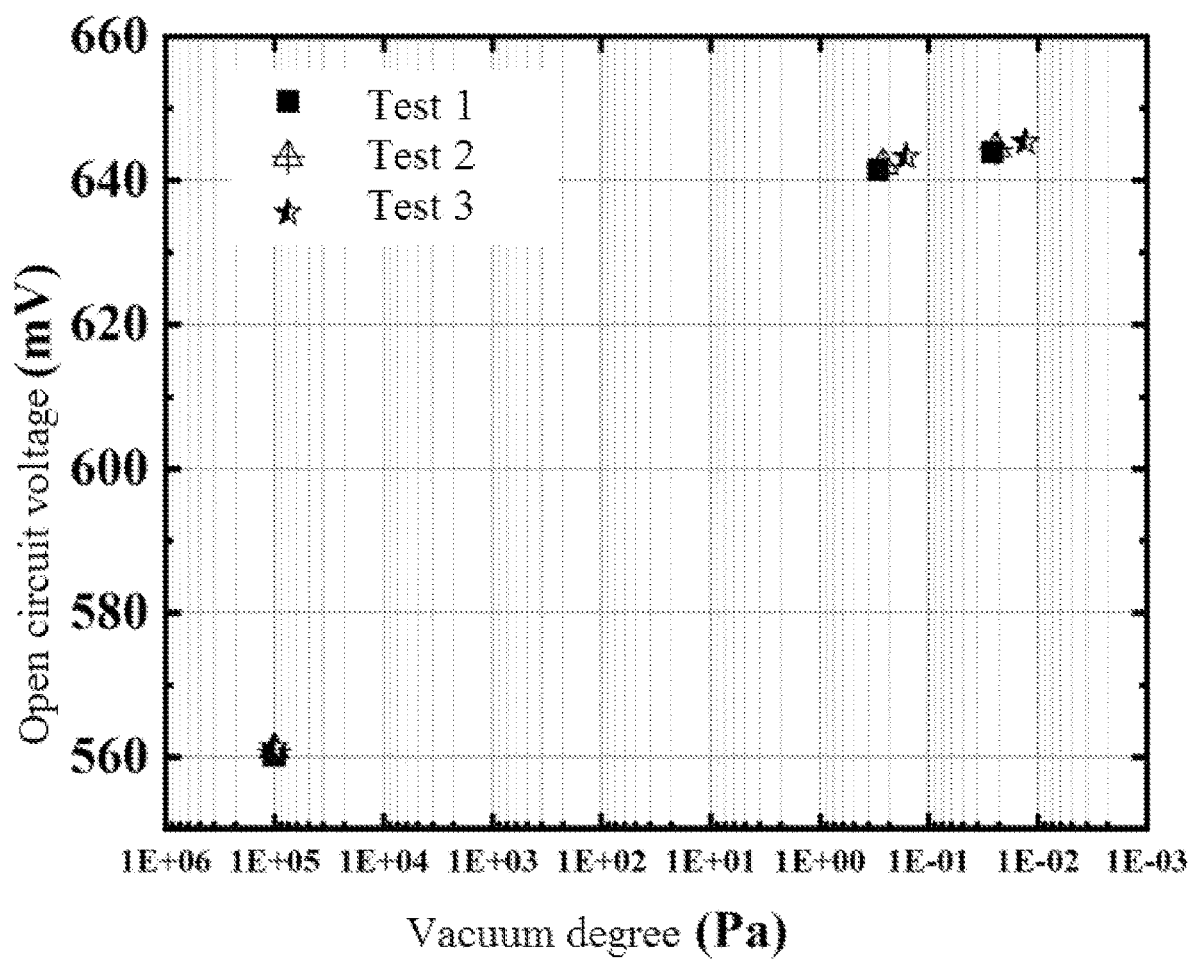
FIG. 10 is a test schematic diagram of the vacuum degree versus the open circuit voltage of the vacuum degree detection device based on the temperature difference power generation device according to an embodiment of the present disclosure.

In another embodiment, as shown in FIG. 8 to FIG. 10, the present disclosure also discloses a vacuum degree detection device based on a temperature difference power generation device, which includes,
a vacuum cavity 6,
a cooling portion 4 supported within the vacuum cavity 6;
a temperature difference power generation device 3, wherein one end of which is laminated on the cooling portion 4, the temperature difference power generation device 3 includes a plurality of pairs of thermoelectric arms, the thermal resistance of the temperature difference power generation device is formed by the thermal resistances of the thermoelectric arms and the thermal resistances of air portions filling gaps in parallel, and when a vacuum degree at which the temperature difference power generation device 3 is located is changed, the thermal resistance of the temperature difference power generation device 3 is changed to generate detection data reflecting the vacuum degree. When a vacuum degree at which the temperature difference power generation device is located is changed, the thermal resistances of the air portions filling the gaps change, which leads to the thermal resistance change of the temperature difference power generation device. The thermal resistance change of the temperature difference power generation device will change distribution of temperature on the thermal resistance block and the temperature difference power generation device, which will change the temperature of the hot end of the temperature difference power generation device and lead to the output voltage change of the temperature difference power generation device. When the temperatures at the heat source portion and the cooling portion of the vacuum degree detection device are constant, the change of vacuum degree is the only factor that causes the change of the overall thermal resistance of the temperature difference power generation device, and thus causes the change of the output voltage of the temperature difference power generation device to generate the detection data reflecting the vacuum degree;
a thermal resistance block 2 laminated on the other end of the temperature difference power generation device 3;
a heat source portion 1 laminated on and heating the thermal resistance block 2; and
a pressure cylinder 7 that applies pressure to the heat source portion 1.

In a preferred embodiment of the vacuum degree detection device based on the temperature difference power generation device 3, the vacuum degree detection device continuously measures air pressure in the range of 1E5 Pa to 1E-2 Pa.

In a preferred embodiment of the vacuum degree detection device based on the temperature difference power generation device 3, the temperature difference power generation device 3 and the thermal resistance block 2 are arranged in series to form a whole.

In a preferred embodiment of the vacuum degree detection device based on the temperature difference power generation device 3, the heat source portion 1 is a ceramic heating sheet or a flexible heating sheet.

In a preferred embodiment of the vacuum degree detection device based on the temperature difference power generation device 3, the material of the thermal resistance block 2 includes nitride, oxide, epoxy resin or glass fiber.

In a preferred embodiment of the vacuum degree detection device based on the temperature difference power generation device 3, the thermal resistance block 2 is provided with a first measuring point connected with a first temperature detection device, and the bottom of the temperature difference power generation device 3 is provided with a second measuring point connected with a second temperature detection device.

In a preferred embodiment of the vacuum degree detection device based on the temperature difference power generation device 3, the first temperature detection device includes a thermocouple, a platinum resistor or a thermistor, and/or the second temperature detection device includes a thermocouple, a platinum resistor or a thermistor.

In a preferred embodiment of the vacuum degree detection device based on the temperature difference power generation device 3, the heat source portion 1 is connected with a DC power source, and the temperature difference power generation device 3 is connected with a data acquisition device.

In a preferred embodiment of the vacuum degree detection device based on the temperature difference power generation device 3, the heat source portion 1 is attached to the thermal resistance block 2 via a copper sheet 5, and the temperature difference power generation device 3 is attached to the cooling portion 4 via a copper sheet 5.

In a preferred embodiment of the vacuum degree detection device based on the temperature difference power generation device 3, the cooling portion 4 is connected with a constant temperature water bath 8 to form a circulating cooling system.

The vacuum degree detection device based on the temperature difference power generation device 3 has a wide range of application fields, and can be used for vacuum measurement in numerous scientific research fields of scientific research and industry using vacuum technology, such as aerospace, electricity, nuclear energy, food and the like, and the specific application occasions include but are not limited to vacuum monitoring of vacuum arc-extinguishing chambers, magnetron sputtering cavities, SPS sintering furnace cavities and the like. The vacuum degree detection device based on the temperature difference power generation device 3 arranges the temperature difference power generation device 3 and the thermal resistance block in series to form a whole, and performs constant heating and cooling control at both ends thereof, respectively, to generate a determined temperature difference. The overall thermal resistance of the temperature difference power generation device 3 is formed by the thermal resistances of the thermoelectric arms and the thermal resistances of air portions filling gaps in parallel. When the vacuum degree where the device is located changed, the thermal resistance of the air will change, thus causing the change of the overall thermal resistance of the device and the redistribution of the temperature difference on the device and the thermal resistance block 2. The output voltage of the device is determined by the temperature and temperature difference on the device. When the temperature of the heat source and the cooling portion of the vacuum degree detection device is constant, the change of vacuum degree is the only factor causing the change of the overall thermal resistance of the temperature difference power generation device, which causes the change of the output voltage of the temperature difference power generation device to generate the detection data reflecting the vacuum degree. On the basis of satisfying the thermal resistance matching principle of the thermal resistance block and the design principle of the temperature difference power generation device, the device can realize continuous measurement in the range of 1e5 Pa-1e-2 Pa, and has the advantages of large vacuum degree measurement range, long service life and simple manufacture, and can well realize vacuum degree measurement.

The shape of each part of the vacuum degree detection device based on the temperature difference power generation device 3 is not limited, and various other shapes such as a circle, a square, a rectangle, and a circular ring are possible. The shapes and cross-sectional dimensions of the parts are optimally matched in a consistent manner. The heat source portion 1 of the vacuum degree detection device may be selected from a ceramic heating sheet, a flexible heating sheet, or any other heat source capable of performing a heating function. The material of the heat resistance block 2 of the vacuum degree detection device needs to have the high resistance characteristic, the specific temperature resistance range needs to be selected according to the temperature at which the vacuum degree detection device is applied, and the hot end temperature signal measuring point at the top thereof needs to be provided for providing the hot end temperature signal, and at the same time, the hot end temperature is fed back to achieve temperature control. The temperature can be measured using various temperature measuring modes such as the thermocouple, the platinum resistor, the thermistors, and the like to provide the hot end temperature signal while feeding back the hot end temperature for temperature control. The optimal selection principle of the thermal resistance is the thermal resistance matching principle of the thermal resistance block, that is, the thermal resistance of the thermal resistance block 2 should be the same as the overall thermal resistance of the temperature difference power generation device 3 at one atmosphere pressure, and other solutions belong to alternatives of the present disclosure, although they do not achieve the maximum voltage change amount to result in a reduced range of measurement of the vacuum degree. The material of the thermal resistance block 2 may be selected from nitride, oxide, epoxy resin, glass fiber, and the like. The thermoelectric material in the temperature difference power generation device 3 of the vacuum degree detection device can be selected according to the application occasion, including $Bi_2Te_3$-based and MgAgSb-based materials in the low temperature region, PbTe-based, GeTe-based and skutterudite materials in the middle temperature region, and silicon-germanium alloy and half-Heusler materials in the high temperature region for device fabrication. At its bottom, the cold end temperature signal measurement point is required for temperature measurement at the cold end of the device. The design principle is that there are as many pairs of thermoelectric arms as possible, ensuring that the output voltage of the temperature difference power generation device is greater than 500 mV at a 200° C. temperature difference of the sensor; the duty cycle is as low as possible, not exceeding 10%; the Seebeck coefficient of the thermoelectric material is as large as possible and needs to reach 200 μv/K; the thermal resistance of the thermoelectric arm portion is as large as possible, and the thermal resistance of the individual thermoelectric arm needs to reach at least 400 K/W. This enables the full-range continuous measurement of the vacuum degree range of 1e5 Pa-1e-2 Pa using the sensor of the present disclosure, and the result can be verified by the embodiments described below. The cooling portion 4 is required to provide stable cooling conditions, and a variety of cooling modes such as water cooling, air cooling, natural cooling or heat transfer cooling with a cryogenic body can be selected. The particular cooling mode may be selected depending on the application occasion. In order to achieve the integrity of the vacuum degree detection device, the connections between the portions may be made by any of a variety of modes such as adhesive bonding, mechanical bonding, self-propagating high temperature composite bonding, fusion welding, brazing, diffusion welding, and the like.

In one embodiment, in the manufacturing process of the vacuum degree detection device based on the temperature difference power generation device 3, a circular ceramic heating sheet having a diameter of 24 mm is manufactured, and a nickel wire is used as a lead-out conductive wire. A zirconia ceramic having a diameter of 24 mm and a height of 32 mm is manufactured as the thermal resistance block 2.

The temperature difference power generation device 3 is manufactured having a diameter of 24 mm and including 16 pairs of thermoelectric arms having dimensions of 1.4*1.4*3 mm. The copper sheet 5 having a diameter of 24 mm and a thickness of 3 mm is manufactured, and a hole having a diameter of 1 mm is punched at the center of the side of the copper sheet 5 for placing a thermocouple for temperature measurement. The brazing process is adopted, the vacuum degree detection device is welded in the order of the ceramic heating sheet, the copper sheet 5, the thermal resistance block 2, the temperature difference power generation device 3, and the copper sheet 5, so as to make it become a whole.

The above device is placed on a water-cooled bottom plate in a vacuum cavity 6, the top is subjected to a pressure of 1 bar using a pressure cylinder 7 to achieve a good contact of the detection device with the water-cooled bottom plate, and the water-cooled bottom plate is subjected to cold-end thermostatic control using the constant temperature water bath 8 with a temperature fluctuation of less than 0.05° C.

The temperature fluctuation is less than 0.1° C. controlled by a temperature controller 9, and the hot end of the device is heated to 200° C. by a DC power supply 10, and the constant temperature water bath Bis set to 5° C. A vacuum system 11 is used for vacuumizing, and the open circuit voltage of the temperature difference power generating device 3 is recorded using a data acquisition device 12 at 1 atmosphere pressure, mechanical pump vacuum limit and molecular pump vacuum limit, respectively. The measurement results are shown in FIG. 10. Different voltages at different vacuum degrees are sufficient to measure and resolve the vacuum degree. Further, the vacuum system 11 also includes a vacuum pump.

Although embodiments of the present disclosure have been described above with reference to the accompanying drawings, the present disclosure is not limited to the particular embodiments and fields of application described above, which are merely illustrative, instructional, and not restrictive. Those skilled in the art, given the enlightenment of the present disclosure, will be able to make numerous forms within the scope of the present disclosure without departing from the scope of the appended claims.

What is claimed is:

1. A vacuum degree detection device of a vacuum arc-extinguishing chamber, comprising;
    a ceramic insulating housing sealingly fixed to an end face cover plate of the vacuum arc-extinguishing chamber, the ceramic insulating housing being a circular ring-shaped structure coaxial with a conductive rod on the end face cover plate, a sealing area formed by the end face cover plate and the ceramic insulating housing being provided with a through hole communicating with the vacuum arc-extinguishing chamber;
    a thermoelectric vacuum sensor disposed inside the ceramic insulating housing to detect the vacuum degree of the vacuum arc-extinguishing chamber, the thermoelectric vacuum sensor comprising;
    a cold end fixed to the end face cover plate through which heat is transferred with the conductive rod;
    an electrode supported on the cold end;
    a thermoelectric arm supported on the electrode;
    a hot end laminated on the thermoelectric arm;
    a thermal resistance block laminated on the hot end; and
    a heating device laminated on the thermal resistance block.

2. The vacuum degree detection device of the vacuum arc-extinguishing chamber according to claim 1, further comprising;
    a conductive sheet conductively connected with the thermoelectric vacuum sensor; and
    a conductive wire penetrating through and soldered on the ceramic insulating housing, the conductive wire being conductively connected with the conductive sheet.

3. The vacuum degree detection device of the vacuum arc-extinguishing chamber according to claim 2, wherein the conductive wire is a cylindrical conductive wire connected with the thermoelectric vacuum sensor and is drawn from the ceramic insulating housing and the end face cover plate through a ceramic insert, and the ceramic insert is welded to the end face cover plate.

4. The vacuum degree detection device of the vacuum arc-extinguishing chamber according to claim 1, wherein the thermoelectric vacuum sensor is a circular ring-shaped structure disposed within the ceramic insulating housing and coaxial with the conductive rod on the end face cover plate.

5. The vacuum degree detection device of the vacuum arc-extinguishing chamber according to claim 1, wherein the ceramic insulating housing is sealingly fixed to an outer side of the end face cover plate away from the vacuum arc-extinguishing chamber, and the through hole is provided on the end face cover plate.

6. The vacuum degree detection device of the vacuum arc-extinguishing chamber according to claim 1, wherein the ceramic insulating housing is sealingly fixed to an inner side of the end face cover plate adjacent to the vacuum arc-extinguishing chamber, and the through hole is provided on the ceramic insulating housing.

7. The vacuum degree detection device of the vacuum arc-extinguishing chamber according to claim 1, wherein the end face cover plate is a static cover plate or a moving cover plate of the vacuum arc-extinguishing chamber.

8. A vacuum arc-extinguishing chamber monitoring system, comprising;
    the vacuum degree detection device of the vacuum arc-extinguishing chamber according to of claim 1;
    a temperature sensor disposed between a thermal resistance block and a heating device to generate temperature data;
    a sensor receiving module receiving a detection signal and temperature data of the vacuum degree detection device;
    a data processing module connected with the sensor receiving module to generate vacuum degree data based on the detection signal and adjust a heating temperature of the heating device based on the temperature data;

a data storage module connected with the data processing module to receive and store the vacuum degree data; and a data monitoring module connected with the data processing module, the data monitoring module performing an alarm when the vacuum degree data exceeds a predetermined threshold value.

9. The vacuum arc-extinguishing chamber monitoring system according to claim 8, wherein the data monitoring module comprises a buzzer or an LED light.

10. The vacuum arc-extinguishing chamber monitoring system of claim 8, further comprising:

a conductive sheet conductively connected with the thermoelectric vacuum sensor; and a conductive wire penetrating through and soldered on the ceramic insulating housing, the conductive wire being conductively connected with the conductive sheet.

11. The vacuum arc-extinguishing chamber monitoring system of claim 10, wherein the conductive wire is a cylindrical conductive wire connected with the thermoelectric vacuum sensor and is drawn from the ceramic insulating housing and the end face cover plate through a ceramic insert, and the ceramic insert is welded to the end face cover plate.

12. The vacuum arc-extinguishing chamber monitoring system of claim 8, wherein the thermoelectric vacuum sensor is a circular ring-shaped structure disposed within the ceramic insulating housing and coaxial with the conductive rod on the end face cover plate.

13. The vacuum arc-extinguishing chamber monitoring system of claim 8, wherein the ceramic insulating housing is sealingly fixed to an outer side of the end face cover plate away from the vacuum arc-extinguishing chamber, and the through hole is provided on the end face cover plate.

14. The vacuum arc-extinguishing chamber monitoring system of claim 8, wherein the ceramic insulating housing is sealingly fixed to an inner side of the end face cover plate adjacent to the vacuum arc-extinguishing chamber, and the through hole is provided on the ceramic insulating housing.

15. The vacuum arc-extinguishing chamber monitoring system of claim 8, wherein the end face cover plate is a static cover plate or a moving cover plate of the vacuum arc-extinguishing chamber.

16. A vacuum arc-extinguishing chamber, comprising:

a ceramic housing being a hollow cylindrical structure;

a static cover plate sealingly brazed to one end of the ceramic housing;

a static conductive rod penetrating through a central position of the static cover plate;

a moving cover plate sealingly brazed to the other end of the ceramic housing;

a moving conductive rod penetrating through a central position of the moving cover plate;

the vacuum degree detection device of the vacuum arc-extinguishing chamber according to claim 1, provided on an upper surface or a lower surface of the end face cover plate and arranged coaxially with the conductive rod; and a shield disposed inside the ceramic housing.

17. The vacuum arc-extinguishing chamber of claim 16, further comprising:

a conductive sheet conductively connected with the thermoelectric vacuum sensor; and a conductive wire penetrating through and soldered on the ceramic insulating housing, the conductive wire being conductively connected with the conductive sheet.

18. The vacuum arc-extinguishing chamber of claim 17, wherein the conductive wire is a cylindrical conductive wire connected with the thermoelectric vacuum sensor and is drawn from the ceramic insulating housing and the end face cover plate through a ceramic insert, and the ceramic insert is welded to the end face cover plate.

19. The vacuum arc-extinguishing chamber of claim 16, wherein the thermoelectric vacuum sensor is a circular ring-shaped structure disposed within the ceramic insulating housing and coaxial with the conductive rod on the end face cover plate.

20. The vacuum arc-extinguishing chamber of claim 16, wherein the ceramic insulating housing is sealingly fixed to an outer side of the end face cover plate away from the vacuum arc-extinguishing chamber, and the through hole is provided on the end face cover plate.

* * * * *